US009647097B2

(12) United States Patent
Bhuwalka et al.

(10) Patent No.: US 9,647,097 B2
(45) Date of Patent: May 9, 2017

(54) VERTICAL TUNNEL FIELD EFFECT TRANSISTOR (FET)

(71) Applicant: Taiwan Semiconductor Manufacturing Company Limited, Hsin-Chu (TW)

(72) Inventors: Krishna Kumar Bhuwalka, Hsin-Chu (TW); Gerben Doornbos, Hsin-Chu (TW); Matthias Passlack, Hsin-Chu (TW)

(73) Assignee: TAIWAN SEMICONDUCTOR MANUFACTURING COMPANY LIMITED, Hsin-Chu (TW)

(*) Notice: Subject to any disclaimer, the term of this patent is extended or adjusted under 35 U.S.C. 154(b) by 0 days.

(21) Appl. No.: 14/578,761

(22) Filed: Dec. 22, 2014

(65) Prior Publication Data
US 2015/0137079 A1    May 21, 2015

Related U.S. Application Data

(63) Continuation of application No. 13/553,405, filed on Jul. 19, 2012, now Pat. No. 8,916,927.

(51) Int. Cl.
H01L 29/66    (2006.01)
H01L 29/739    (2006.01)
(Continued)

(52) U.S. Cl.
CPC ........ *H01L 29/66977* (2013.01); *B82Y 10/00* (2013.01); *H01L 29/068* (2013.01);
(Continued)

(58) Field of Classification Search
CPC ........... H01L 29/66356; H01L 29/7391; H01L 29/0657; H01L 29/0676; H01L 29/7827;
(Continued)

(56) References Cited

U.S. PATENT DOCUMENTS 8,049,203 B2 * 11/2011 Samuelson ............ B82Y 10/00
257/13
8,563,380 B2 * 10/2013 Richter .................. B82Y 10/00
257/E21.41
(Continued)

FOREIGN PATENT DOCUMENTS

BE    EP 2378557 A1 * 10/2011 ............ B82Y 10/00
BE    EP 2808897 A1 * 12/2014 ....... H01L 29/66666

OTHER PUBLICATIONS

Leonelli, et al., "Novel Architecture to Boost the Vertical Tunneling in Tunnel Field Effect Transistors", SOI Conference (SOI), 2011 IEEE International, http://ieeexplore.ieee.org/xpl/articleDetails.jsp?reload=true&arnumber=6081704&contentType=Conference+Publications, Oct. 3-6, 2011, pp. 1-2.
(Continued)

*Primary Examiner* — William F Kraig
*Assistant Examiner* — Edward Chin
(74) *Attorney, Agent, or Firm* — Cooper Legal Group, LLC

(57) ABSTRACT

Among other things, one or more techniques for forming a vertical tunnel field effect transistor (FET), and a resulting vertical tunnel FET are provided herein. In an embodiment, the vertical tunnel FET is formed by forming a core over a first type substrate region, forming a second type channel shell around a circumference greater than a core circumference, forming a gate dielectric around a circumference greater than the core circumference, forming a gate electrode around a circumference greater than the core circumference, and forming a second type region over a portion of the second type channel shell, where the second type has a doping opposite a doping of the first type. In this manner, line tunneling is enabled, thus providing enhanced tunneling efficiency for a vertical tunnel FET.

21 Claims, 10 Drawing Sheets

(51) Int. Cl.
- H01L 29/775 (2006.01)
- H01L 29/06 (2006.01)
- B82Y 10/00 (2011.01)
- H01L 29/423 (2006.01)
- H01L 29/78 (2006.01)

(52) U.S. Cl.
CPC ...... *H01L 29/0657* (2013.01); *H01L 29/0676* (2013.01); *H01L 29/0688* (2013.01); *H01L 29/42372* (2013.01); *H01L 29/66356* (2013.01); *H01L 29/66439* (2013.01); *H01L 29/66666* (2013.01); *H01L 29/7391* (2013.01); *H01L 29/775* (2013.01); *H01L 29/7827* (2013.01)

(58) Field of Classification Search
CPC ............. H01L 29/165; H01L 29/66666; H01L 29/0665; H01L 29/068; H01L 29/205; H01L 29/267; H01L 29/66977; H01L 21/26586
USPC .............. 257/329, E21.09, E21.362, E21.41, 257/E21.632, E27.062, E29.022, E29.195, 257/E29.245, E29.255, E29.262, 24, 27, 257/335, 401; 438/268, 212, 478, 585
See application file for complete search history.

(56) References Cited

U.S. PATENT DOCUMENTS

| | | | |
|---|---|---|---|
| 9,318,583 B2* | 4/2016 | Verhulst | H01L 29/068 |
| 2007/0228491 A1* | 10/2007 | Forbes | H01L 29/0657 257/401 |
| 2009/0026491 A1* | 1/2009 | Booth, Jr. | H01L 29/7391 257/105 |
| 2010/0176459 A1* | 7/2010 | Wernersson | B82Y 10/00 257/392 |
| 2010/0200916 A1* | 8/2010 | Gossner | H01L 29/083 257/335 |
| 2011/0049476 A1* | 3/2011 | Bjoerk | H01L 29/7391 257/24 |
| 2011/0253981 A1* | 10/2011 | Rooyackers | B82Y 10/00 257/24 |
| 2012/0187376 A1* | 7/2012 | Tomioka | B82Y 10/00 257/24 |
| 2014/0021532 A1* | 1/2014 | Bhuwalka | H01L 29/66356 257/329 |
| 2014/0054549 A1* | 2/2014 | Loh | H01L 29/66356 257/27 |
| 2014/0203350 A1* | 7/2014 | Chuang | H01L 29/66356 257/329 |
| 2014/0203351 A1* | 7/2014 | Chuang | H01L 29/66356 257/329 |
| 2014/0203352 A1* | 7/2014 | Chuang | H01L 29/66356 257/329 |
| 2014/0231902 A1* | 8/2014 | Chuang | H01L 29/7827 257/329 |

OTHER PUBLICATIONS

Ganjipour, et al., "High Current Density Esaki Tunnel Diodes Based on GaSb—InAsSb Heterostructure Nanowires", Sep. 6, 2011, http://pubs.acs.org/doi/abs/10.1021/nl202180b, pp. 4222-4226.

Li, et al., "AlGaSb/InAs Tunnel Field-Effect Transistor With On-Current of 78 µA/µm at 0.5 V", IEEE Electron Device Letters, vol. 33, No. 3, Mar. 2012, pp. 363-365.

* cited by examiner

VERTICAL TUNNEL FIELD EFFECT TRANSISTOR (FET)

RELATED APPLICATIONS

This application is a continuation of and claims priority to U.S. Non-Provisional application Ser. No. 13/553,405, titled "VERTICAL TUNNEL FIELD EFFECT TRANSISTOR (FET)" and filed on Jul. 19, 2012, which is incorporated herein by reference.

BACKGROUND

Generally, a tunneling field effect transistor (FET) is a device where drive current is dominated by inter-band tunneling and comprises a tunneling junction. Gated PIN diodes (e.g., tunnel FETs) have been shown to have similar tunneling device characteristics where current-voltage characteristics can be controlled by applying bias to the terminals of the device. These tunneling determined current-voltage characteristics enable a sub-threshold swing (e.g., gate voltage swing needed to increase the drain current by one decade (10×)) to not be limited to a thermal limit of 60 mV/dec, such as for conventional metal-oxide-semiconductor field-effect transistors (MOSFETs), for example. Accordingly, the sub-threshold swing in tunnel FETs are thus scalable. Various methods of fabrication have been proposed for tunnel FETs, such as different device designs. For example, a point tunneling FET generally comprises a tunneling region where tunneling occurs parallel to the gate. Thus, vertical and horizontal architectures have been proposed to enhance the tunneling probability. However, as tunneling occurs parallel to the gate, the tunneling direction is not aligned to the gate electric field. Hence, the tunneling efficiency is not efficient. Additionally, the sub-threshold swing of the point tunneling FET degrades as a function of gate bias. This degradation is undesirable as it limits $V_{DD}$ scaling and also the drive current and effective swing needed to turn on the devices. Line tunneling FET on the other hand, has been proposed such that tunneling occurs perpendicular to the gate and a tunneling direction is aligned to the gate electric field. However, such structures are made on homogeneous materials, and require heavily doped tunneling regions. To this end, a planar line tunneling FET is generally difficult to manufacture. Further, planar line tunneling devices require large gate-source overlap regions in order to have significant tunneling and are therefore non-scalable with respect to area required on the chip. Further, these devices also require stringent doping and/or geometry requirements at least due to the heavily doped tunneling region, for example. Accordingly, a device length and/or a gate length associated with a planar line tunneling FET generally is not scalable at least because the heavily doped region must lie on top of a source region and under a gate region. For example, in some FETs, a gate region must overlap at least a portion of the source region. Additionally, at least some current drifts from a channel of the FET to a drain of the FET, rather than tunneling, as desired. Issues arising from forming ultra-thin layers and/or tunneling regions, sharp tunneling junctions, heavy doping, and/or non-self aligning structures thus complicate fabrication associated with planar line tunneling FETs with doped junctions.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

Among other things, one or more techniques and/or systems for forming a vertical tunnel field effect transistor (FET) are provided herein. In an embodiment, a vertical tunnel FET is formed by forming a core over a first type substrate region, forming a second type channel shell around a circumference of at least the core, forming a gate dielectric around the circumference of at least the core, forming a gate electrode around the circumference of at least the core, and forming a second type region over at least a portion of the second type channel shell. In an embodiment, the core comprises a nano-wire architecture, and the second type comprises a doping opposite a doping of the first type.

Accordingly, a vertical tunnel FET comprising enhanced tunneling efficiency is provided such that a tunneling path is aligned with a gate electric field direction. To this end, electron tunneling occurs along the tunneling path parallel to the gate electric field direction. Accordingly, a sub-threshold swing associated with switching of the vertical tunnel FET is thus improved by several orders of magnitude. In an embodiment, supply voltage is scaled and/or reduced such that a reduced amount of voltage is applied to the vertical tunnel FET to facilitate switching. For example, the vertical tunnel FET requires less supply voltage by comparison to other tunnel FETs, for example. According to an aspect, transistor density is increased at least because of a vertical arrangement associated with an architecture of the vertical tunnel FET. For example, more transistors fit in a given area at least because the nano-wire architecture of a vertical tunnel FET enables a FET to occupy space in a vertical fashion, rather than horizontally.

The following description and annexed drawings set forth certain illustrative aspects and implementations. These are indicative of but a few of the various ways in which one or more aspects are employed. Other aspects, advantages, and/or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

It will be appreciated that at least some of the following cross-sectional illustrations merely illustrate a portion of a cross-sectional view of an example vertical tunnel field effect transistor (FET). For example, the portion of the cross-sectional view is merely one side of the vertical tunnel FET, rather a portion, such as a half cross section of a cylindrical wire.

DETAILED DESCRIPTION

Figure 1:
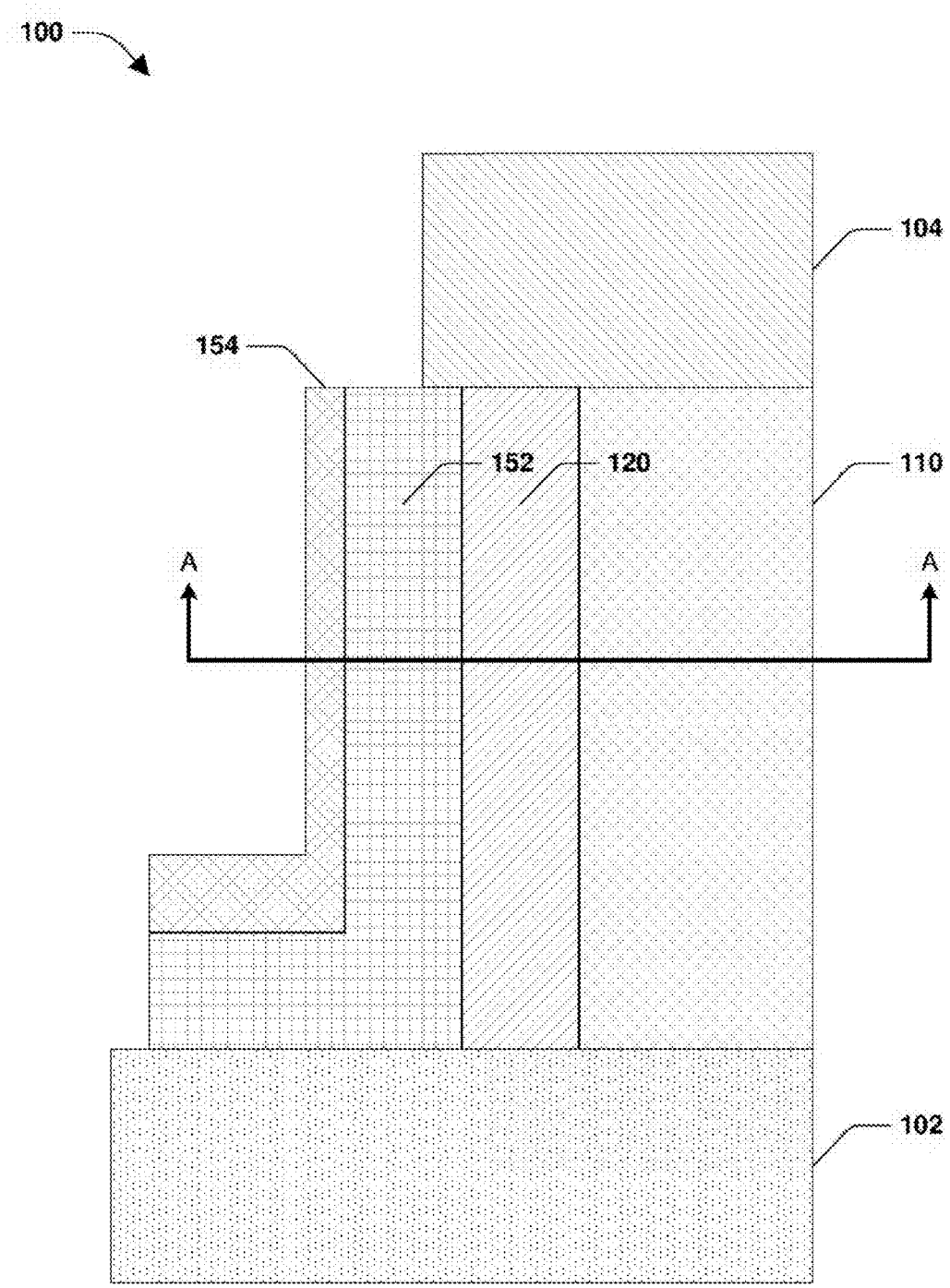
FIG. 1 is a portion of a cross-sectional view of an example vertical core-shell nanowire tunnel field effect transistor (FET), according to an embodiment.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

Generally, it is desired for a field effect transistor (FET), such as a tunnel FET to achieve switching from an off state to an on state and/or vice versa with a steep swing while mitigating leakage current. For example, an on current associated with a speed of the swing and off current is generally associated with leakage. To this end, an on to off ratio of the respective currents is associated with a voltage level for achieving FET switching. It is generally desirable to achieve a reduced voltage level for switching at least because a supply voltage ($V_{DD}$) is reduced accordingly. To this end, one or more techniques for forming a vertical tunnel FET comprising enhanced tunneling efficiency, which promotes a reduced voltage level for switching, are provided herein. In an embodiment, the vertical tunnel FET is formed by forming a core over a first type substrate region, forming a second type channel shell around a circumference of at least a circumference of the core, forming a gate dielectric around the circumference of at least the circumference of the core, forming a gate electrode around the circumference of at least the circumference of the core, and forming a second type region over a portion of the second type channel shell. In an embodiment, the core comprises a nano-wire architecture and the second type comprises a doping opposite a doping of the first type.

According to an aspect, the vertical tunnel FET provides for enhanced tunneling efficiency at least because line tunneling is enabled at least due to the nano-wire architecture of the vertical tunnel FET. For example, a tunneling path for electrons is substantially aligned parallel to a gate electric field direction, where a tunneling path or direction oriented other than substantially parallel to a gate electric field direction inhibits electron flow, movement, etc. Additionally, the vertical tunnel FET is scalable at least due to the vertical nature of the FET, thus enabling scaling. According to an aspect, scaling comprises device size scaling, supply voltage scaling, and/or $V_{DD}$ scaling. Moreover, transistor density is increased at least because vertical devices occupy less surface area of a substrate, for example, than planar devices. For example, vertical tunnel FETs comprise a vertical architecture configured to occupy less space when viewed from a physical layout view at least because the vertical tunnel FETs formed vertically from a small footprint, rather than horizontally or laterally with an expansive footprint. Additionally, tunneling probability is enhanced by the vertical core-shell architecture such that the tunneling occurs perpendicular to a gate, while mitigating use of heavily doped tunneling regions and/or large gate-source overlap regions.

FIG. 1 illustrates a cross-sectional view 100 of an example vertical tunnel field effect transistor (FET). In an embodiment, the vertical tunnel FET comprises a first type substrate region 102, a core 110, a second type channel shell 120, a gate dielectric 152, a gate electrode 154, and a second type region 104. In an embodiment, the core 110, the second type channel shell 120, the gate dielectric 152, and the gate electrode 154 comprise a vertical architecture and/or vertical orientation with respect to the first type substrate region 102. In another embodiment, the core 110 comprises a nano-wire architecture, which is described in more detail herein. It will be appreciated that the second type comprises a doping opposite a doping of the first type. For example, if the first type substrate region 102 comprises a p-type material, the second type channel shell 120 and the second type region 104 comprise an n-type material. Conversely, if the first type substrate region 102 comprises an n-type material, the second type channel shell 120 and the second type region 104 comprise a p-type material. According to an aspect, the first type substrate 102 comprises a source region and the second type region comprises a drain region. It will be appreciated that in other embodiments, the first type substrate 102 comprises the drain region and the second type region comprises the source region.

It will be appreciated that "circumference" is used herein to mean and/or reference a perimeter and/or the like, and does not necessarily limit a shape of an associated structure to circular and/or cylindrical, for example. For example, circumference is viewed as a cross-section perpendicular to the cross-sectional view 100 of FIG. 1, such as taken along line A-A, for example. To this end, it will be appreciated that any of the structures described herein, including, but not limited to, the substrate 102, the core 110, the second type channel shell 120, the gate dielectric 152, the gate electrode 154, and/or the second type region 104, etc. comprise a variety of possible shapes. In an embodiment, such structures comprise at least one of a cylindrical shape, a rectangular shape, a square shape, a cubic shape, a triangular shape, etc. when viewed from the cross-section perpendicular to the cross-sectional view 100 of FIG. 1.

Additionally, it will be appreciated that in other embodiments, cross-sectional views herein merely comprise a portion of the vertical tunnel FET. For example, at least some of the cross-sectional views comprise a view of merely one quadrant of a vertical tunnel FET. That is, for example, if a vertical tunnel FET comprises a wire shape and/or a cylindrical shape, at least some of the cross-sectional views of the figures are associated with at least two cross-section cuts. For example, a first cross-sectional cut cuts the vertical tunnel FET vertically, and a second cross-sectional cut, offset by about ninety degrees from the first cross-sectional cut, cuts the vertical tunnel FET vertically such that the second cross-sectional cut is substantially perpendicular to the first cross-sectional cut. In other words, a figure merely illustrates a left portion and/or a right portion of a cross-section of a vertical tunnel FET, for example. For example, a full cross-section of a vertical tunnel FET also comprises a mirror of that which is illustrated in FIG. 1. For example, in an embodiment, second type channel shell 120 comprises a shell "wrapped" around core 110, and thus comprises a portion to the right, which is not shown in FIG. 1, of core 110. Accordingly, the first type substrate region 102, the gate dielectric 152, the gate electrode 154, and/or the second type region 104 comprise respective portions that have a mirror arrangement relative to a second portion, such as a second half, for example, of the core, where the second portion of the core is likewise not illustrated as the core has been vertically cut, and thus the second portion of the core is located to the right of the left portion of the core which is illustrated. It is to be appreciated that this vertically cut arrangement is likewise depicted in other Figs. as well.

In an embodiment, the core 110 comprises a first type material. In this embodiment, the second type channel shell 120 is formed around a circumference of at least the core 110 to enable line tunneling of electrons at least from the core 110 to the second type channel shell 120. In an embodiment, the core 110 comprises a p-type core comprising GaSb, and the second type channel shell 120 comprises n-type material comprising InAs. In another embodiment, n-type and p-type materials comprise a broken-gap architecture, for example.

In an embodiment, the gate dielectric 152 comprises an equivalent oxide thickness (EOT) less than 1 nm and the gate electrode 154 comprises at least one of polysilicon or metal. According to an aspect, the second type region 104 is formed over at least a portion of the second type channel shell 120. According to another aspect, the second type region 104 is formed over at least a portion of the core 110. In an embodiment, the gate dielectric 152 is formed such that the gate electrode 154 is not in contact with the first type substrate region 102. For example, in an embodiment, the gate dielectric 152 and/or the gate electrode 154 comprises an "L" shape when viewed from a cross-section.

In an embodiment, line tunneling is enabled via the core 110 and the second type channel shell 120. For example, in an embodiment, tunneling occurs from the core 110 to the second type channel shell 120. To this end, a tunneling path parallel to the gate electric field direction enables electron tunneling parallel to the gate electric field. That is, for example, if the core 110 comprises a p-type material and the second type channel shell 120 comprises an n-type material, electron tunneling occurs from the core 110 to the second type channel shell 120. To this end, current flows vertically through the vertical tunnel FET, such that the current flow is substantially perpendicular to the electron tunneling, for example. In an embodiment, current flow, such as flow of electrons and/or holes, for example, generally flows vertically through second type channel shell 120 between the first type substrate region 102 and the second type region 104. In another embodiment, tunneling occurs from the second type channel shell 120 into the core 110. To this end, the vertical tunnel FET of FIG. 1 provides for enhanced tunneling efficiency at least because of an alignment of a tunneling path for electrons. Additionally, the vertical tunnel FET is scalable, enables an increase in transistor density, and is manufactured with ease, without requiring heavy doping, such as into a substrate, for example, at least due to a vertical nano-wire architecture associated with the vertical tunnel FET.

Figure 2:
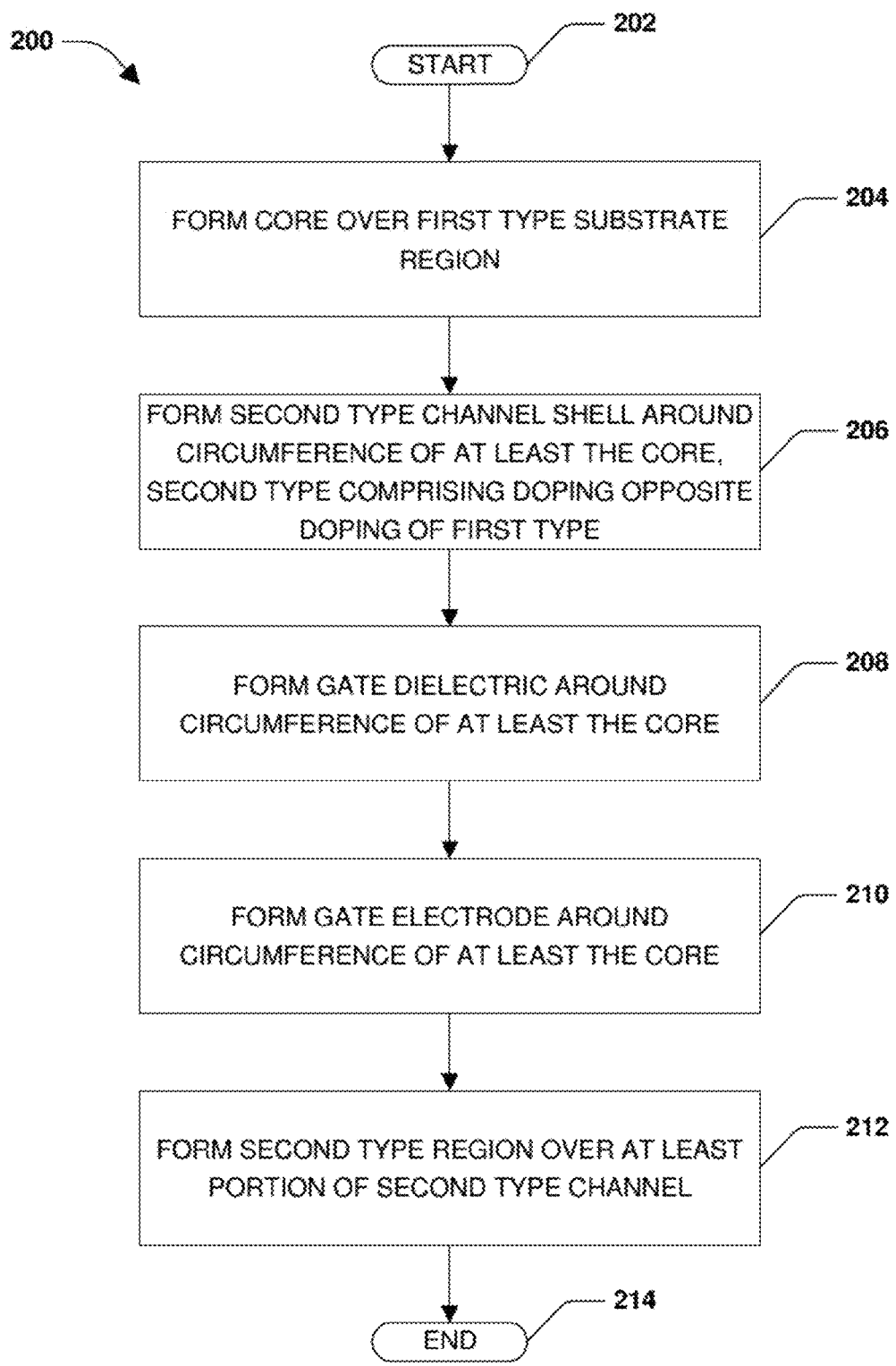
FIG. 2 is a flow diagram of an example method for forming a vertical tunnel field effect transistor (FET), according to an embodiment.

FIG. 2 illustrates a flow diagram of an example method 200 for forming a vertical tunnel field effect transistor (FET). At 202, the method 200 starts. At 204, a core is formed over a first type substrate region. According to an aspect, the first type substrate region is doped. In an embodiment, the core comprises a first type material. In another embodiment, the core is formed of a wide bandgap buffer material such that the wide bandgap buffer core provides structural support. In an embodiment, the wide bandgap buffer core is formed from a nano-wire core. In an example, the wide bandgap buffer core is configured to provide physical support for the vertical nano-wire architecture of a vertical tunnel FET. To this end, the support provided by the wide bandgap buffer enables one or more surrounding shells to comprise a thinner profile, as they need not be dimensioned to provide structural support or integrity, for example. To this end, a second type channel shell, a first type shell, a gate dielectric, and/or a gate electrode comprise a thickness from several nanometers to several hundred nanometers, for example. In an embodiment, the wide bandgap buffer forms a shell rather than or in addition to a core.

At 206, a second type channel shell is formed around a circumference of at least the core, where the second type comprises a doping opposite a doping of the first type. In an embodiment, the core is formed of a first type material. For example, the core and/or first type substrate region are formed of a p-type material and the second type channel shell is formed of an n-type material. In another example, the core and/or first type substrate region are formed of an n-type material and the second type channel shell is formed of a p-type material.

According to an aspect, the core is formed of a wide bandgap buffer material, and a first type shell is formed around a circumference of at least the core. In this example, the second type channel shell is formed 206 around a circumference of at least the first type shell. However, it will be appreciated that in other embodiments, the second type channel shell is formed 206 around a circumference of at least the core while the first type shell is formed around a circumference of at least the second type channel shell.

In an embodiment, a wide bandgap barrier is formed around a circumference of at least the core. To this end, the wide bandgap barrier is configured to mitigate diffusion associated with a leakage floor. For example, diffusion occurring between a first type core and the second type channel shell is generally undesirable. Accordingly, the wide bandgap buffer is configured to inhibit this diffusion such that leaking is mitigated, for example. In an embodiment, the wide bandgap buffer is thus formed between a first type core and the second type channel shell.

At 208, a gate dielectric is formed around a circumference of at least the core. At 210, a gate electrode is formed around a circumference of at least the core. According to an aspect, the gate dielectric is formed 208 such that the gate electrode is not in contact with the first type substrate region, for example. In other words, the gate dielectric is formed 208 such that the gate dielectric is between and/or separates the gate electrode and the first type substrate region from one another, for example.

At 212, a second type region is formed over at least a portion of the second type channel. For example, the second type region is grown horizontally and/or laterally from at least a portion of at least one of the core and/or shells, etc. In an embodiment, the second type region is formed over at least a portion of the core. In other embodiments, the second type region is formed over at least a portion of at least one of the first type shell, the wide bandgap barrier, the wide bandgap buffer, and/or the gate dielectric. In an embodiment, the first type and second type comprise a material system based on a broken-gap architecture.

In an embodiment, the core is grown by seeding at least a portion of the first type substrate region to form a seed layer. To this end, at least a portion of the seed layer is patterned, thus enabling growth of the core, for example. It will be appreciated that the core, the second type channel shell, the first type shell, the gate dielectric, the gate electrode, and/or the second type region are formed in a variety of ways. For example, respective shells and/or layers are formed based at least in part on at least one of molecular beam epitaxy (MBE), chemical vapor deposition (CVD), physical vapor deposition (PVD), a growth process, a selective growth process, a non-selective growth process, orientation dependent growth, an etching process, a non-selective etching process, and/or selective etching. Additionally, it will be appreciated that one or more shells and/or layers are formed in any order relative to one another. In an embodiment any one or more shells and/or layers are doped during formation. For example, in an embodiment, the second type channel shell is formed adjacent to the core and the first type shell is formed around the second type channel shell. At 214, the method 200 ends.

Figure 3:
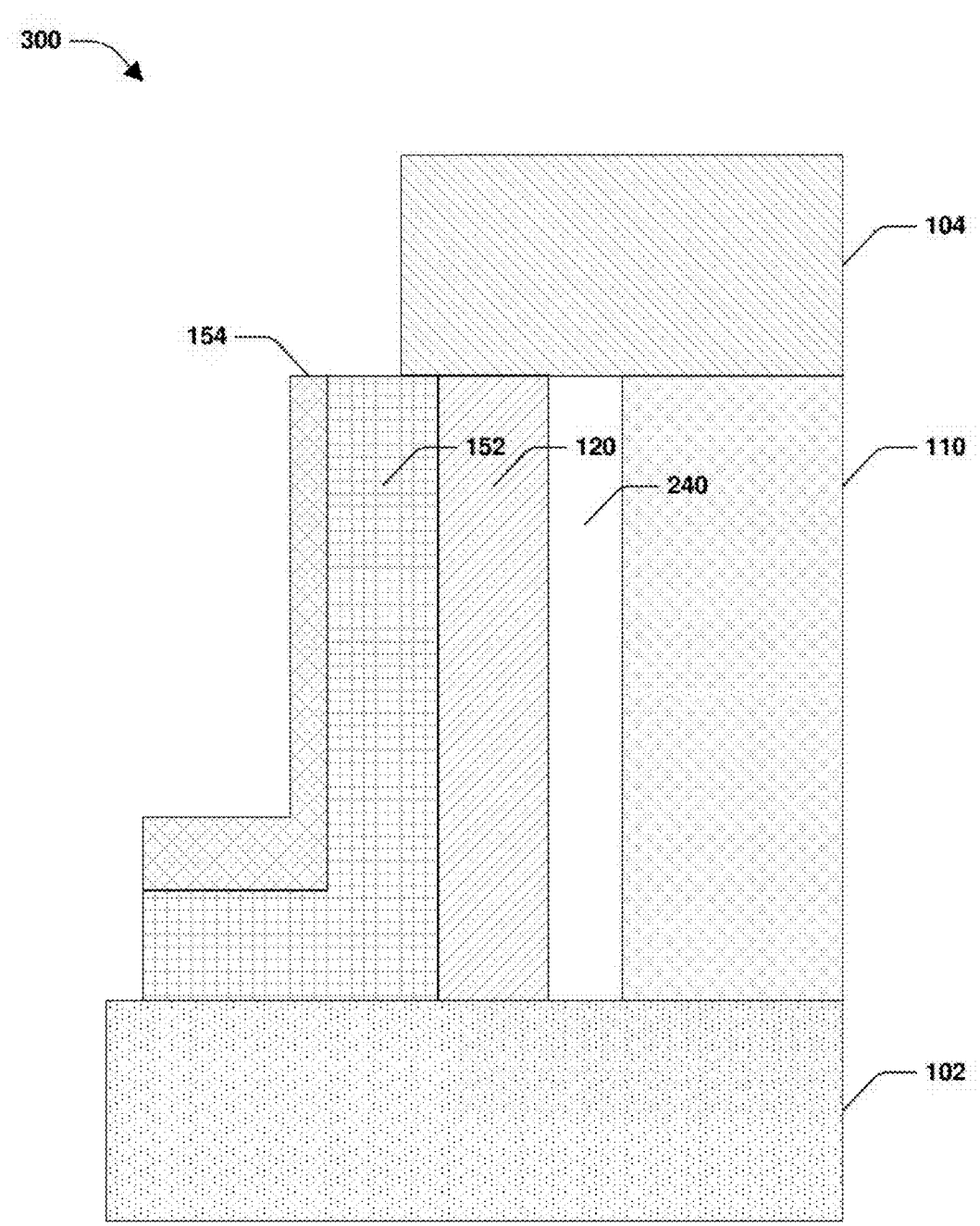
FIG. 3 is a cross-sectional view of an example vertical tunnel field effect transistor (FET), according to an embodiment.

FIG. 3 illustrates a cross-sectional view 300 of an example vertical tunnel field effect transistor (FET). In an embodiment, the example vertical tunnel FET comprises a first type substrate region 102, core 110, wide bandgap barrier 240, second type channel shell 120, gate dielectric 152, gate electrode 154, and second type region 104. In an embodiment the core 110 is vertically aligned with respect to the first type substrate region 102. For example, the core 110 is grown vertically from the first type substrate region 102. In an embodiment, the core 110 comprises a diameter ranging from a few nanometers to several hundred nanometers.

In an embodiment, the wide bandgap barrier 240 is configured to mitigate leakage between the first type core 110 and the second type channel shell 120. In an embodiment, leakage is mitigated by suppressing diffusion associated with a leakage floor. In another embodiment, the wide bandgap barrier 240 is configured to mitigate leakage between a first type shell and the second type channel shell 120. To this end, the wide bandgap barrier mitigates leakage at least because reducing unwanted diffusion from the core 110 to the second type channel shell 120 generally reduces leakage.

According to an aspect, the core 110 is grown in a vertical direction from a patterned seed layer (not shown) on first type substrate region 102. In an example, wide bandgap barrier 240 is grown in a horizontal direction from core 110. In this example, the core 110 acts as a seed layer for the wide bandgap barrier 240. To this end, the wide bandgap barrier acts as a seed layer for additional horizontal growth accordingly. Additionally, second type channel shell 120, gate dielectric 152, and/or gate electrode 154 are similarly grown, respectively. Second type region 104 is grown from core 110 and formed to cover at least some of the aforementioned layers 240, 120, 152. In an embodiment, second type region 104 is laterally etched such that the second type region 104 covers the second type channel shell 120, but not the gate electrode 154, for example. It will be appreciated that second type region 104 is grown in the vertical direction and/or the horizontal direction, according to a desired profile. For example, the second type region 104 is grown vertically from the core 110 and is then grown horizontally or laterally from the portion of the second type region that has been grown vertically. It will be appreciated that in some embodiments, the second type region 104 is grown horizontally and/or vertically. For example, the second type region is grown both horizontally and/or vertically in a growth process.

Figure 4:
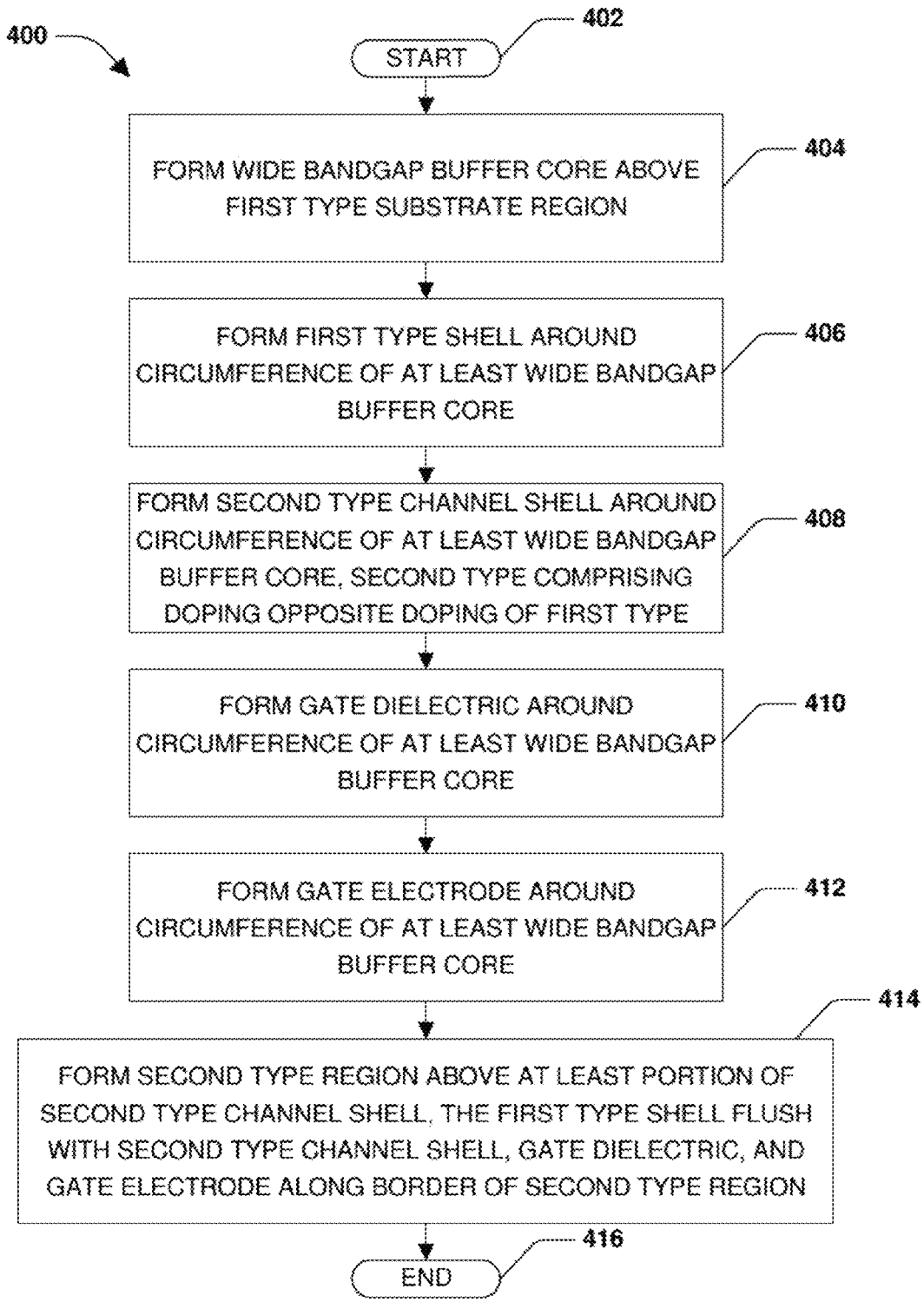
FIG. 4 is a flow diagram of an example method for forming a vertical tunnel field effect transistor (FET), according to an embodiment.

FIG. 4 illustrates a flow diagram of an example method 400 for forming a vertical tunnel field effect transistor (FET). At 402, the method 400 begins, and at 404 a wide bandgap buffer core is formed above a first type substrate region. In an embodiment, the wide bandgap buffer core is formed based on a vertical nano-wire core architecture designed to provide support for the vertical tunnel FET and/or layers within the vertical tunnel FET. For example, in an embodiment, the wide bandgap buffer core enables shells and/or layers surrounding the core to comprise a thin profile, thus reducing a size of the vertical tunnel FET from a design layout view, for example. That is, due to the structural integrity afforded by the wide bandgap buffer core, one or more shells and/or layers surrounding the core have respective thicknesses that are less than they would otherwise be in the absence of the wide bandgap buffer core. To this end the wide bandgap buffer core is grown vertically and comprises a vertical orientation and/or profile with respect to the first type substrate region, for example.

At 406, a first type shell is formed around a circumference of at least the wide bandgap buffer core. In an embodiment, the shell is grown in a horizontal fashion from the core and comprises p-type material. In another embodiment, the first type shell comprises an n-type material. At 408, a second type channel shell is formed around a circumference of at least the wide bandgap buffer core, where the second type comprises a doping opposite a doping of the first type. In an embodiment, the second type channel shell is formed around a circumference of at least the first type shell. In another embodiment, the first type shell is formed around a circumference of at least the second type channel shell, for example. In some embodiments, a wide bandgap barrier is formed between the first type shell and the second type channel shell, for example. The wide bandgap barrier is formed to, among other things, mitigate undesired leakage between the first type shell and the second type channel shell.

At 410, a gate dielectric is formed around a circumference of at least the wide bandgap buffer core. In an embodiment, the gate dielectric is formed around a circumference of at least the second type channel shell. To this end, a gate electrode is formed around a circumference of at least the wide bandgap buffer core at 412. According to an aspect, the gate electrode is formed around a circumference of at least the gate dielectric, for example.

At 414, a second type region is formed above at least a portion of the second type channel shell. For example, the second type region is formed by horizontal and/or lateral growth associated with at least a portion of at least one of the core, shells, and/or other layers. In an embodiment, the first type shell is flush with the second type channel shell, the gate dielectric, and the gate electrode along a border of the second type region. In another embodiment, the second type region is formed above at least a portion of the second type channel shell, the first type shell, and the gate dielectric. In yet another embodiment, the second type region is formed above at least a portion of the second type channel shell, the first type shell, the gate dielectric, and the wide bandgap buffer core. In this embodiment, the first type shell is flush with the second type channel shell, the gate dielectric, the gate electrode, and the wide bandgap buffer core along a border of the second type region. At 416, the method 400 ends.

Figure 5:
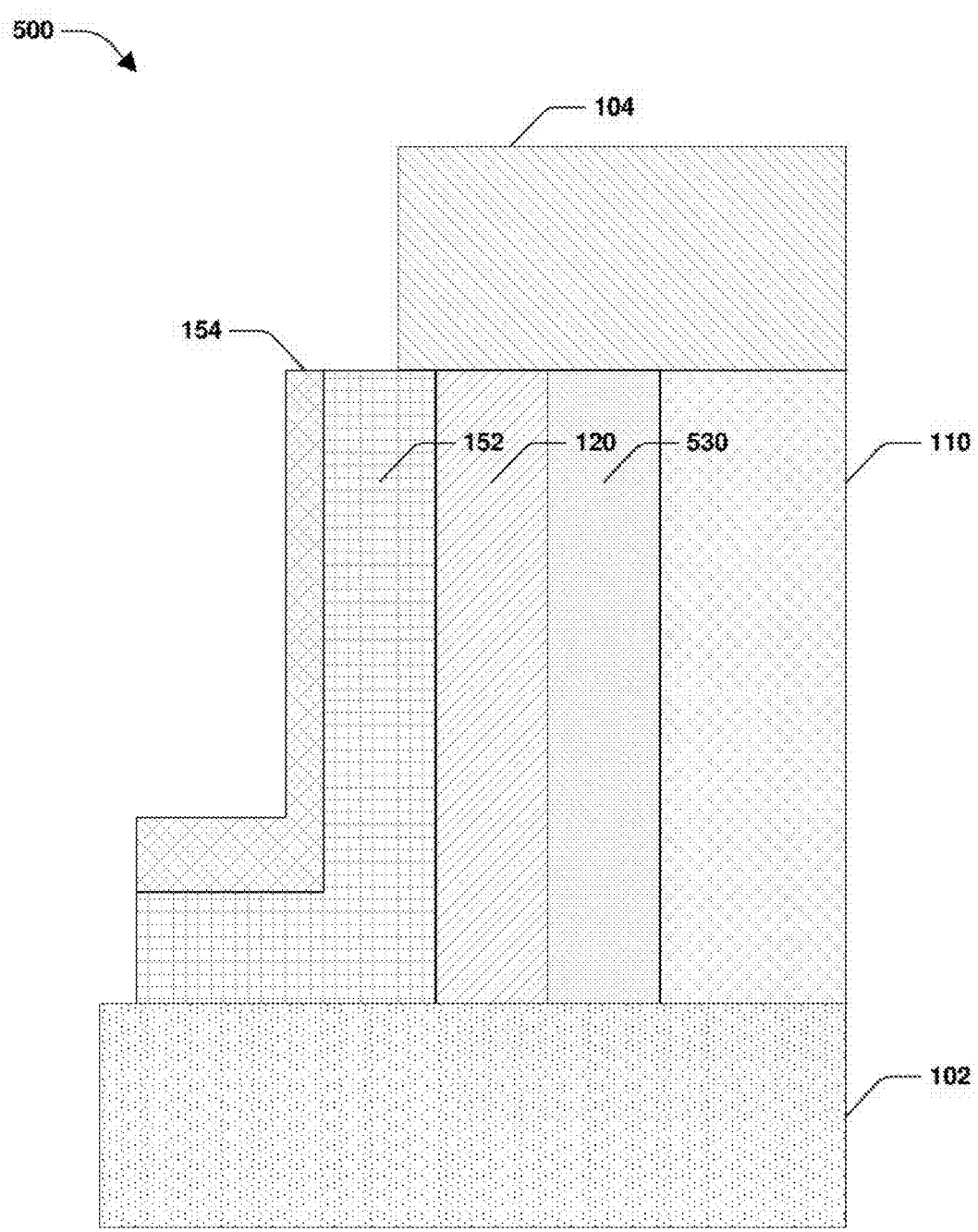
FIG. 5 is a cross-sectional view of an example vertical tunnel field effect transistor (FET), according to an embodiment.

FIG. 5 illustrates a cross-sectional view 500 of an example vertical tunnel field effect transistor (FET). In an embodiment, the vertical tunnel FET comprises first type substrate region 102, wide bandgap buffer core 110, first type shell 530, second type channel shell 120, gate dielectric 152, gate electrode 154, and second type region 104, for example. It will be appreciated that the first type comprises a doping opposite a doping of the second type and vice versa. For example, if a first type comprises an n-type material, a second type generally comprises a p-type material. Additionally, gate dielectric 152 is configured to mitigate electrical contact between gate electrode 154 and first type substrate region 102, for example. In this example, the core comprises a wide bandgap buffer core 110. To this end, the wide bandgap buffer provides physical support for an architecture associated with the vertical tunnel FET. In an embodiment, the wide bandgap buffer comprises at least one of AlAsSb or GaAs.

In an embodiment, the vertical tunnel FET of FIG. 5 is fabricated by seeding the first type substrate region 102 to form a seed layer and patterning the seed layer such that the seed layer corresponds to wide bandgap buffer core 110. To this end, the wide bandgap buffer core 110 is vertically grown based on the corresponding patterned seed layer and the first type substrate 102. In this example, first type shell 530 is grown horizontally from the wide bandgap buffer core 110. Second type channel shell 120 is horizontally grown from the first type shell 530, and gate dielectric 152 is grown horizontally from the second type channel shell 120. In an embodiment, the gate dielectric 152 is grown vertically to form a rectangular shape, followed by horizontal selective growth at a base of the gate dielectric 152 to form an "L" shape. In another embodiment, gate dielectric 152 is grown, and a portion is selectively etched to form the "L" shape. To this end, gate 154 is similarly formed, such as by vertical growth, horizontal growth and/or etching, for example. In an embodiment, second type region 104 is grown vertically above the wide bandgap buffer core 110 and laterally and/or horizontally to cover at least the second type channel shell 120. For example, second type region 104 is grown using nano-wire growth to enable growth in a horizontal direction and/or a vertical direction.

In another embodiment, the vertical tunnel FET is fabricated by patterning the seed layer to comprise a width of second type region 104 and growing the wide bandgap buffer core 110 over first type substrate region 102, such that the wide bandgap buffer core 110 has a width corresponding to the width of the second type region 104. Second type region 104 is grown over the wide bandgap buffer core 110. Given that the wide bandgap buffer core 110 has a width corresponding to the width of the second type region 104, the wide bandgap buffer core 110 is etched horizontally to produce the wide bandgap buffer core configuration illustrated in FIG. 5, where the width of the wide bandgap buffer core is less than the width of the second type region 104. Respective shells and/or layers are grown from the wide bandgap buffer core accordingly. For example, the first type shell 530, second type channel shell 120, gate dielectric 152, and gate electrode 154 are grown in a successive fashion. Additionally, in an example, a wide bandgap barrier is grown between the first type shell 530 and the second type channel shell 120. In an embodiment, the wide bandgap barrier comprises a shell shape, such as similar to other layers, for example.

Figure 6:
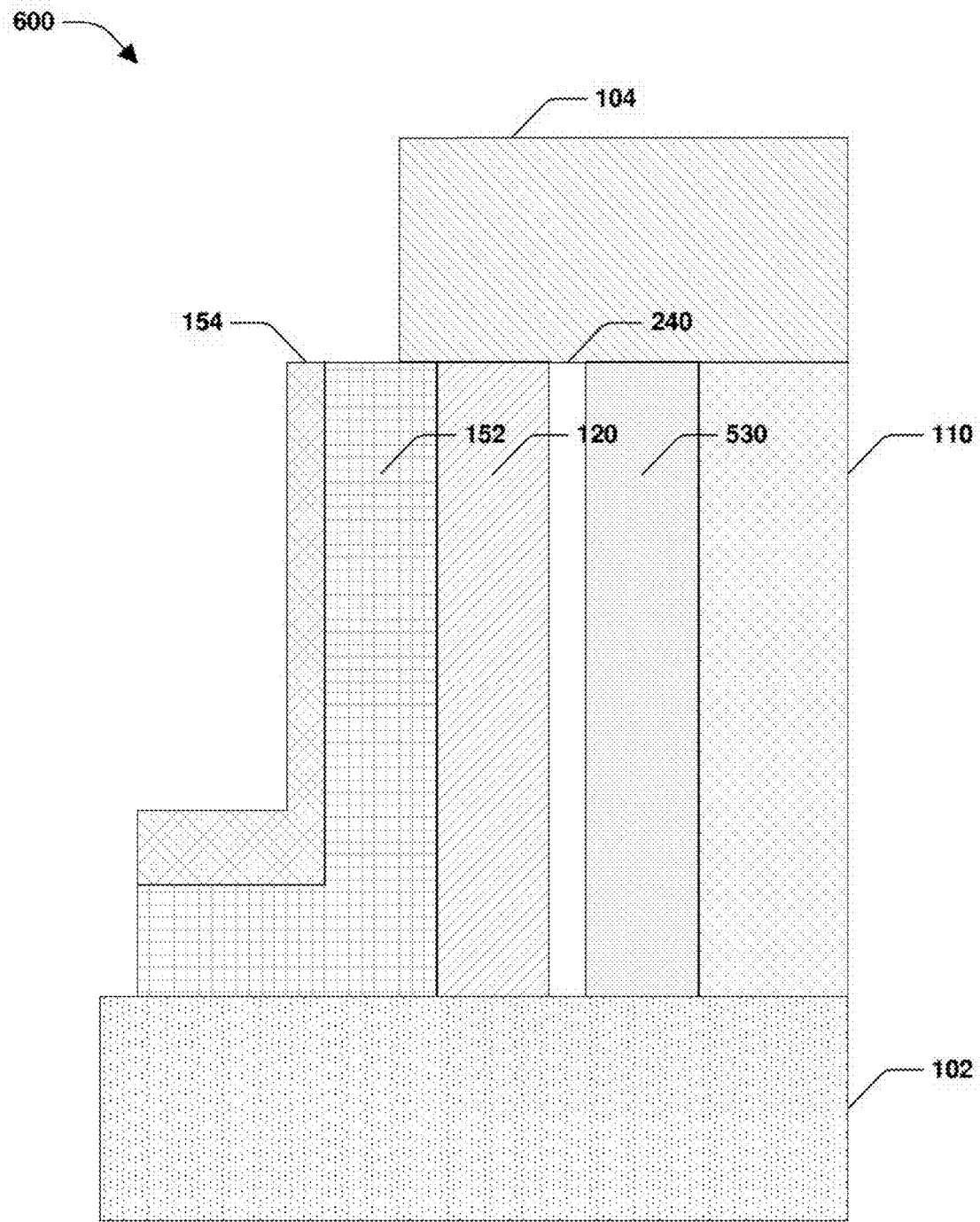
FIG. 6 is a cross-sectional view of an example vertical tunnel field effect transistor (FET), according to an embodiment.

FIG. 6 illustrates a cross-sectional view 600 of an example vertical tunnel field effect transistor (FET). In an embodiment, the vertical tunnel FET comprises first type substrate region 102, wide bandgap buffer core 110, first type shell 530, wide bandgap barrier 240, second type channel shell 120, gate dielectric 152, gate electrode 154, and second type region 104, for example. In this example, the core comprises a wide bandgap buffer core 110 configured to provide physical support for a nano-wire architecture associated with the vertical tunnel FET. In an embodiment, the second type region 104 is formed over at least a portion of the second type channel shell 120. In another embodiment, the second type region 104 is formed over at least a portion of at least one of the core 110, the first type shell 530, the wide bandgap barrier 240, or the gate dielectric 152. In an embodiment the first type substrate region 102 is doped.

In an embodiment, the vertical tunnel FET of FIG. 6 is fabricated by seeding the first type substrate region 102 to form a seed layer and patterning the seed layer such that the seed layer corresponds to a wide bandgap buffer core 110. That is, the patterned seed layer has a width corresponding to a width of the wide bandgap buffer core 110. To this end, the wide bandgap buffer core 110 is vertically grown based on the corresponding patterned seed layer and the first type substrate 102. In this example, the wide bandgap barrier 240 is horizontally grown from the first type shell 530.

Figure 7:
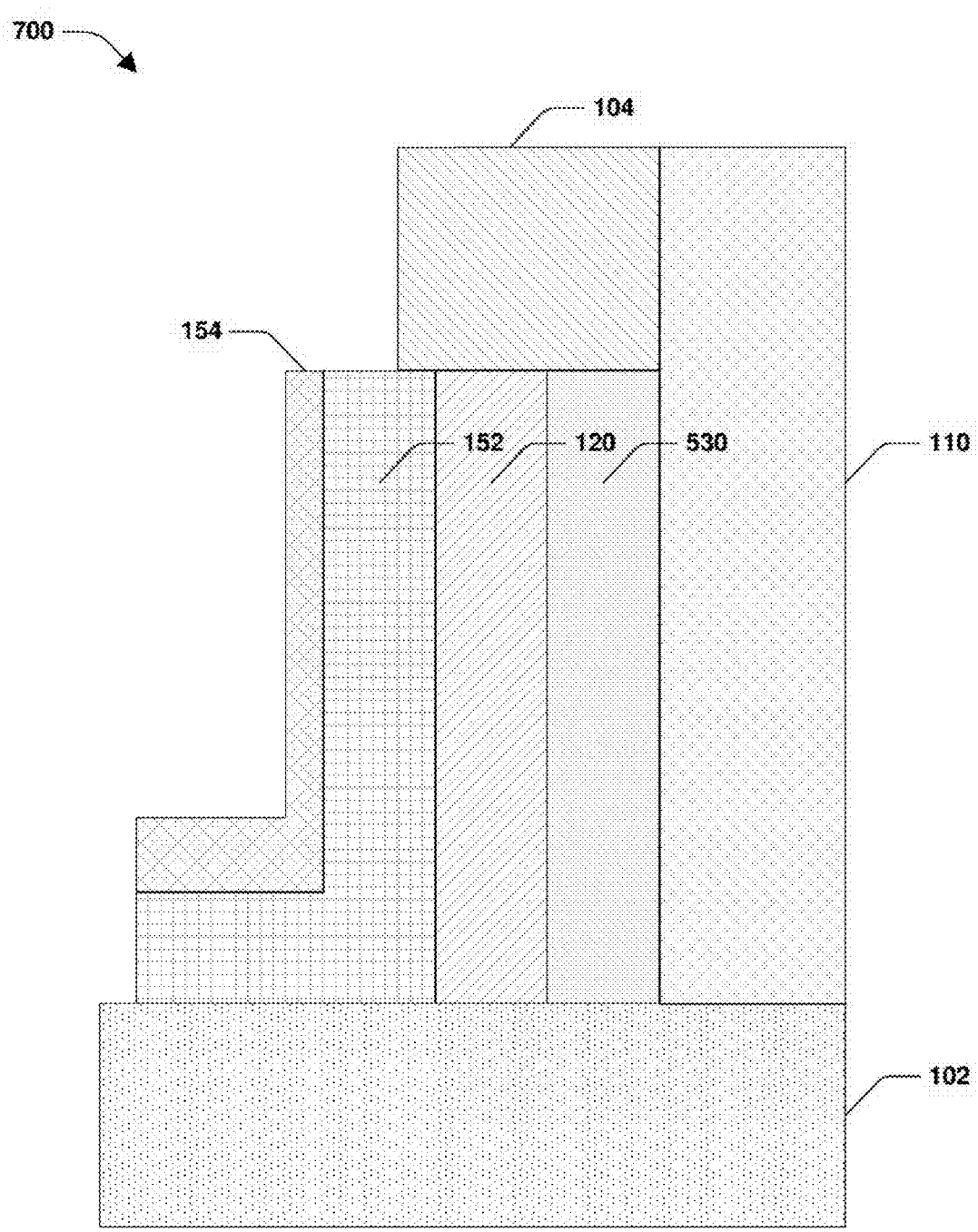
FIG. 7 is a cross-sectional view of an example vertical tunnel field effect transistor (FET), according to an embodiment.
Figure 8:
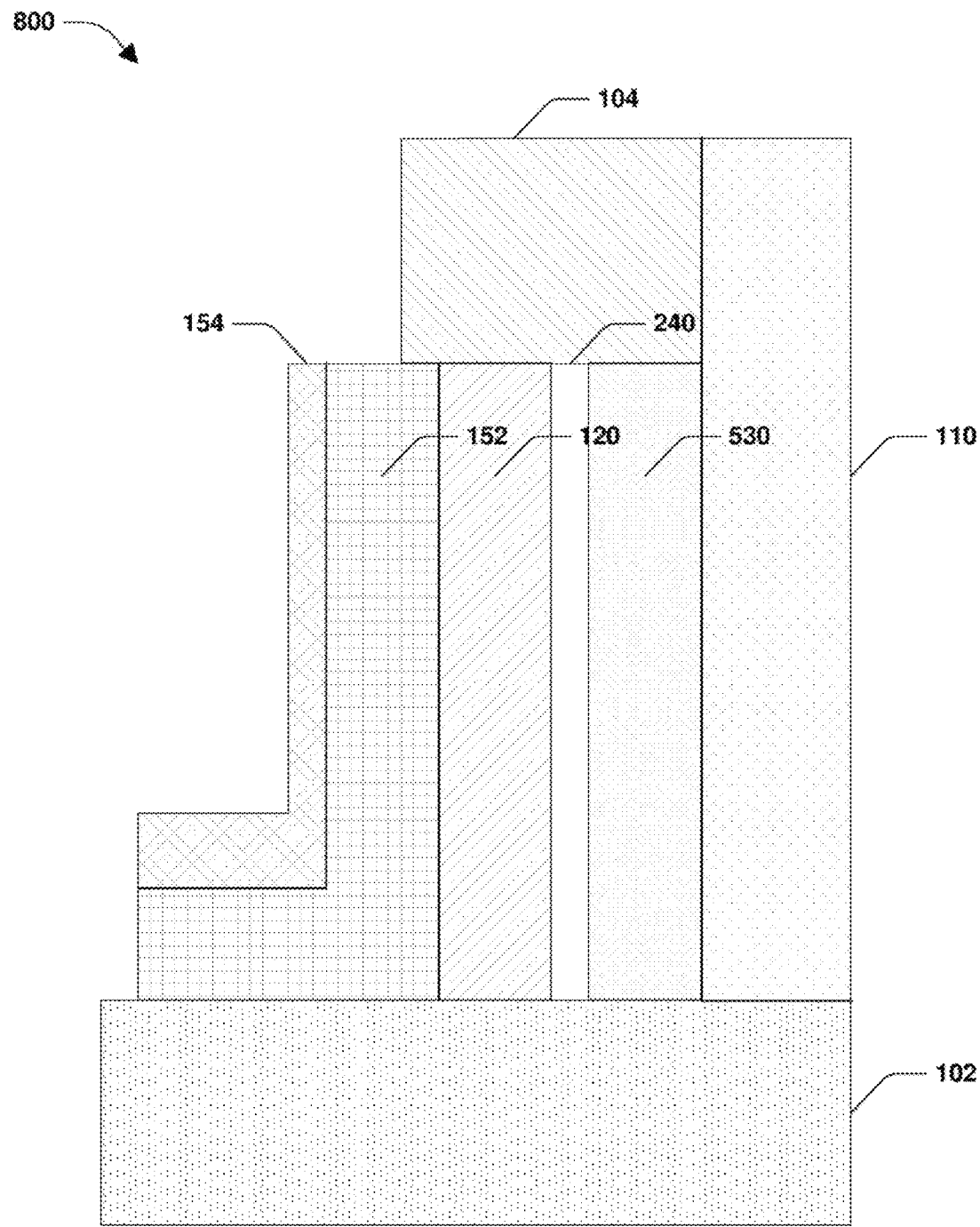
FIG. 8 is a cross-sectional view of an example vertical tunnel field effect transistor (FET), according to an embodiment.

In other embodiments, the second type region 104 does not cover a core of the vertical tunnel FET. For example, FIG. 7 illustrates a cross-sectional view 700 of an example vertical tunnel field effect transistor (FET) where the second type region 104 does not cover a core 110 of the vertical tunnel FET. In another example, FIG. 8 illustrates a cross-sectional view 800 of an example vertical tunnel field effect transistor (FET) where the second type region 104 similarly does not cover a core 110 of the vertical tunnel FET. In FIGS. 7 and 8, the vertical tunnel FET comprises a first type substrate region 102, a core 110, a first type shell 530, a second type channel shell 120, a gate dielectric 152, a gate electrode 154, and a second type region 104, for example. In FIG. 8, however, a wide bandgap barrier 240 is also disposed between the first type shell 530 and the second type channel shell 120, whereas such a wide bandgap barrier is not included in FIG. 7. In an embodiment, the core 110 comprises a wide bandgap buffer core configured to provide at least some structural and/or mechanical support for at least one of the first type shell 530, the second type channel shell 120, the gate dielectric 152, and/or the gate electrode 154. In an embodiment, the structural integrity afforded by the wide bandgap buffer core 110 enables at least one of the first type shell 530, the second type channel shell 120, the gate dielectric 152, and/or the gate electrode 154 to be formed to a thickness less than otherwise permissible in the absence of the wide bandgap buffer core. In an embodiment, respective shells and/or layers are less than 2 nm thick. For example, the wide bandgap buffer core 110 provides additional structural and/or mechanical support at least because the second type region 104 does not cover the wide bandgap buffer core 110, enabling the core to comprising an additional length, at least relative to an embodiment where the second type region 104 covers the wide bandgap buffer core, for example.

In an embodiment, a seed layer is deposited and patterned on first type substrate region 102. To this end, after patterning, the seed layer corresponds to an area where the wide bandgap buffer core 110 is grown, for example. Accordingly, the wide bandgap buffer core 110 is grown vertically over the first type substrate region 102. In an embodiment, the wide bandgap buffer core is grown to a height corresponding to a height of the first type shell 530, and the first type shell 530 is grown horizontally from the wide bandgap buffer core 110. To this end, the second type channel shell 120, wide bandgap barrier 240 of FIG. 8, gate dielectric 152, and/or gate electrode 154 are grown similarly. In this embodiment, wide bandgap buffer core 110 is grown to a second height that is higher than the height of the first type shell 530 and the second type region 104 is grown horizontally from the wide bandgap buffer core 110 and/or vertically from at least some of at least one of the first type shell 530, the wide bandgap barrier 240, the second type channel shell 120, the gate dielectric 152, the gate electrode 154, and/or other materials, for example. For example, the second type region 104 is grown horizontally or laterally from the portion of the wide bandgap buffer core 110 that extends above first type shell 530.

In another embodiment, the wide bandgap buffer core 110 is grown to a height higher than a height of the first type shell 530. In this embodiment, first type shell 530 is at least one of grown using selective growth or grown horizontally along the wide bandgap buffer core 110 and etched such that the height of the first type shell 530 is less than the height of the wide bandgap buffer core 110. To this end, second type channel shell 120, gate dielectric 152, and/or gate electrode 154 are formed in a similar fashion, for example. Accordingly, second type region 104 is grown horizontally and/or vertically such that the second type region 104 covers at least a portion of the second type channel shell 120. In an embodiment, the second type region is grown and etched to create a desired profile and/or shape.

Figure 9A:
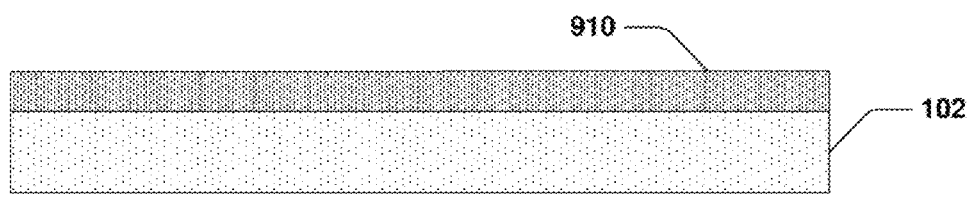
FIG. 9A is a cross-sectional view of example growth associated with a vertical tunnel field effect transistor (FET), according to an embodiment.
Figure 9B:
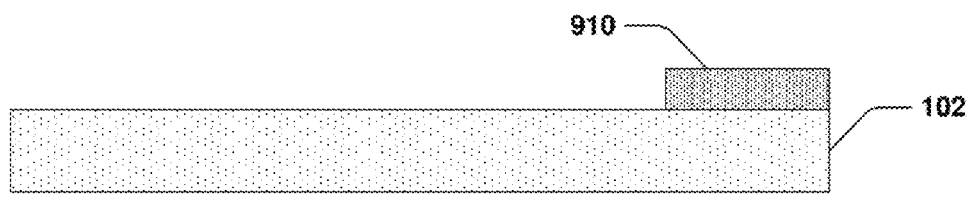
FIG. 9B is a cross-sectional view of example growth associated with a vertical tunnel field effect transistor (FET), according to an embodiment.
Figure 9C:
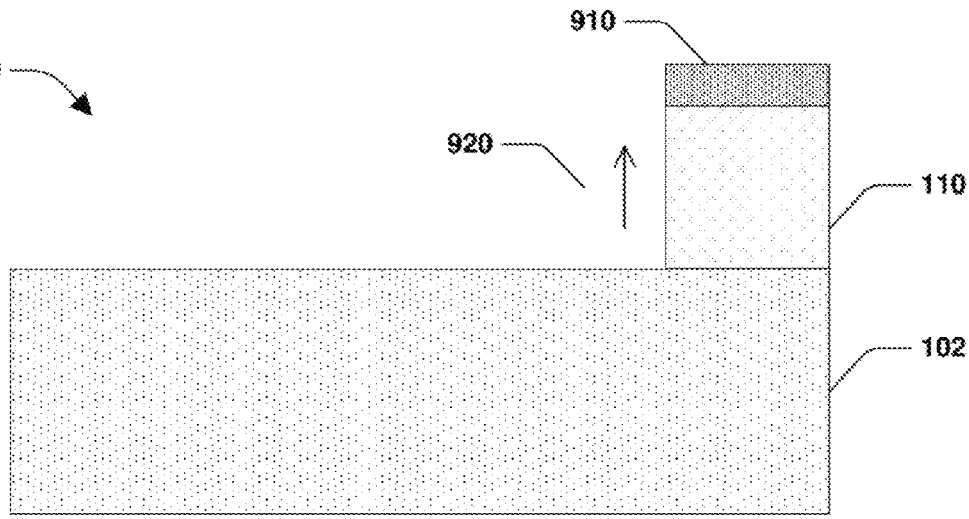
FIG. 9C is a cross-sectional view of example growth associated with a vertical tunnel field effect transistor (FET), according to an embodiment.

FIG. 9A illustrates a cross-sectional view 900 of example growth associated with a vertical tunnel field effect transistor (FET). For example, a seed layer 910 is deposited on first type substrate region 102. In an embodiment, the seed layer 910 comprises gold (Au), for example. It will be appreciated that a variety of techniques exist for depositing the seed layer 910, such as chemical vapor deposition (CVD), for example. FIG. 9B illustrates a cross-sectional view 940 of example growth associated with a vertical tunnel field effect transistor (FET) where the seed layer 910 is patterned. In an embodiment, the seed layer is patterned using a mask (not shown). FIG. 9C illustrates a cross-sectional view 980 of example growth associated with a vertical tunnel field effect transistor (FET). In an embodiment, growth occurs such that the seed layer 910 remains on top of core growth 920, while the core 110 is formed vertically over first type substrate region 102.

Figure 10A:
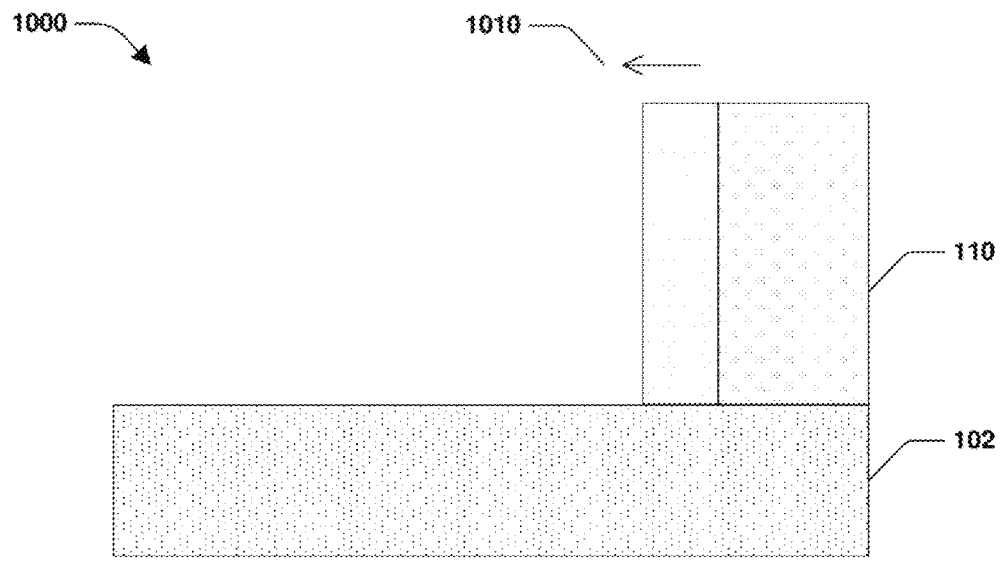
FIG. 10A is a cross-sectional view of example growth associated with a vertical tunnel field effect transistor (FET), according to an embodiment.
Figure 10B:
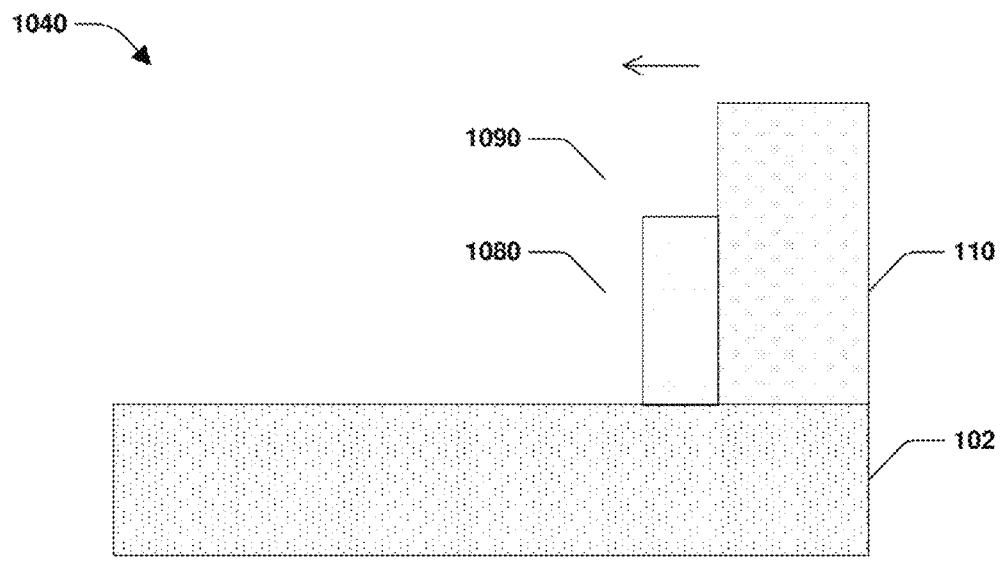
FIG. 10B is a cross-sectional view of example growth associated with a vertical tunnel field effect transistor (FET), according to an embodiment.

FIG. 10A illustrates a cross-sectional view 1000 of example growth associated with a vertical tunnel field effect transistor (FET). For example, a core 110 is grown on top of at least a portion of first type substrate region 102. In this example, a layer 1010 is horizontally grown from core 110. FIG. 10B illustrates a cross-sectional view 1040 of example growth associated with a vertical tunnel field effect transistor (FET). In an embodiment, a layer 1080 is selectively grown 1090 such that a height of the layer 1080 is less than a height of the core 110, for example. In another embodiment, etching is utilized to achieve the height of layer 1080 such that the height is less than the height of core 110. For example, etching at 1090 enables control of a size, height, and/or thickness of layer 1080 such that layer 1080 comprises a desired profile. In this way, an enhanced vertical tunnel FET is provided. The examples illustrated in FIGS. 10A and 10B are possible techniques for forming the second type region 104 in one or more aforementioned embodiments, for example.

According to an aspect, a method for forming a vertical tunnel field effect transistor (FET) is provided, comprising forming a core over a first type substrate region, forming a second type channel shell around a circumference of at least the core, the second type comprising a doping opposite a doping of the first type, forming a gate dielectric around the circumference of at least the core, forming a gate electrode around the circumference of at least the core, and forming a second type region over at least a portion of the second type channel shell.

According to an aspect, a vertical tunnel FET comprises a first type substrate, a core disposed above the first type substrate, a second type channel shell surrounding a circumference of at least the core, the second type comprising a doping opposite a doping of the first type, a gate dielectric surrounding the circumference of at least the core, a gate electrode surrounding the circumference of at least the core, and a second type region disposed above at least a portion of the second type channel shell.

According to an aspect, a method for forming a vertical tunnel FET is provided, comprising forming a wide bandgap buffer core above a first type substrate region, forming a first type shell around a circumference of at least the wide bandgap buffer core, forming a second type channel shell around a circumference of at least the wide bandgap buffer core, the second type comprising a doping opposite a doping of the first type, forming a gate dielectric around the circumference of at least the wide bandgap buffer core, forming a gate electrode around the circumference of at least the wide bandgap buffer core, and forming a second type region above at least a portion of the second type channel shell, the first type shell flush with the second type channel shell, the gate dielectric, and the gate electrode along a border of the second type region.

Although the subject matter has been described in language specific to structural features and/or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

It will be appreciated that layers, features, elements, such as the first type substrate region, core, wide bandgap buffer core, first type shell, second type channel shell, wide bandgap barrier, gate electrode, gate dielectric, second type region, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as implanting techniques, doping techniques, spin-on techniques, sputtering techniques such as magnetron or ion beam sputtering, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A vertical tunnel field effect transistor (FET), comprising:
   a semiconductor core comprising a doping of a first type material;
   a second type channel shell around the semiconductor core, wherein the second type channel shell comprises a doping of a second type material opposite the doping of the first type material and the second type channel shell extends around a circumference of the semiconductor core; and
   a gate electrode around the second type channel shell.

2. The vertical tunnel FET of claim 1, comprising:
   a gate dielectric disposed between the second type channel shell and the gate electrode.

3. The vertical tunnel FET of claim 1, comprising:
   a first type substrate region in contact with the semiconductor core and the second type channel shell.

4. The vertical tunnel FET of claim 3, comprising:
   a gate dielectric disposed between the second type channel shell and the gate electrode and disposed between the first type substrate region and the gate electrode.

5. The vertical tunnel FET of claim 1, comprising:
   a second type region in contact with the semiconductor core and the second type channel shell.

6. The vertical tunnel FET of claim 5, comprising:
   a first type substrate region in contact with the semiconductor core and the second type channel shell.

7. The vertical tunnel FET of claim 6, wherein the second type channel shell is disposed between the first type substrate region and the second type region.

8. The vertical tunnel FET of claim 6, wherein the semiconductor core is disposed between the first type substrate region and the second type region.

9. The vertical tunnel FET of claim 6, wherein:
   the second type channel shell is disposed between the first type substrate region and the second type region, and
   the semiconductor core is in contact with a sidewall of the second type region.

10. The vertical tunnel FET of claim 1, comprising:
    a wide bandgap barrier disposed between the semiconductor core and the second type channel shell.

11. The vertical tunnel FET of claim 10, comprising:
    a first type substrate region; and
    a second type region, the wide bandgap barrier disposed between the first type substrate region and the second type region.

12. The vertical tunnel FET of claim 1, comprising:
    a first type shell disposed between the semiconductor core and the second type channel shell.

13. The vertical tunnel FET of claim 12, comprising:
    a first type substrate region; and
    a second type region, the first type shell disposed between the first type substrate region and the second type region.

14. The vertical tunnel FET of claim 12, comprising:
    a wide bandgap barrier disposed between the first type shell and the second type channel shell.

15. The vertical tunnel FET of claim 14, comprising:
    a first type substrate region; and
    a second type region, the first type shell and the wide bandgap barrier disposed between the first type substrate region and the second type region.

16. The vertical tunnel FET of claim 1, wherein a physical interface is defined between a sidewall of the semiconductor core and a sidewall of the second type channel shell.

17. A vertical tunnel field effect transistor (FET), comprising:
    a semiconductor core comprising a doping of a first type material;
    a second type channel shell around the semiconductor core, wherein the second type channel shell comprises a doping of a second type material opposite the doping of the first type material and the second type channel shell extends around a circumference of the semiconductor core;
    a gate electrode around the second type channel shell;
    a first type substrate region; and
    a second type region, wherein:
       the semiconductor core and the second type channel shell are disposed between the first type substrate region and the second type region.

18. The vertical tunnel FET of claim 17, wherein:
    the semiconductor core and the second type channel shell are in contact with the first type substrate region, and
    the semiconductor core and the second type channel shell are in contact with the second type region.

19. A method for forming a vertical tunnel field effect transistor (FET), comprising:
    forming a semiconductor core comprising a doping of a first type material;
    forming a second type channel shell around the semiconductor core, wherein the second type channel shell comprises a doping of a second type material opposite the doping of the first type material and the second type channel shell extends around a circumference of the semiconductor core; and
    forming a gate electrode around the second type channel shell.

20. The method of claim 19, comprising forming a first type shell around the semiconductor core, wherein the second type channel shell is further formed around the first type shell.

21. A vertical tunnel field effect transistor (FET), comprising:
    a semiconductor core comprising a doping of a first type material;

a second type channel shell around the semiconductor core, the second type channel shell comprising a doping of a second type material opposite the doping of the first type material;
a first type shell disposed between the semiconductor core and the second type channel shell; and
a gate electrode around the second type channel shell.

* * * * *